United States Patent [19]
Brainerd et al.

[11] Patent Number: 5,942,355
[45] Date of Patent: Aug. 24, 1999

[54] METHOD OF FABRICATING A PHASE-SHIFTING SEMICONDUCTOR PHOTOMASK

[75] Inventors: Steve Brainerd; J. Brett Rolfson, both of Boise, Id.

[73] Assignee: Micron Technology, Inc., Boise, Id.

[21] Appl. No.: 08/706,474

[22] Filed: Sep. 4, 1996

(Under 37 CFR 1.47)

[51] Int. Cl.[6] .................................................... G03F 9/00
[52] U.S. Cl. ................................................................ 430/5
[58] Field of Search ................................ 430/5, 312, 313, 430/314, 322, 323

[56] References Cited

U.S. PATENT DOCUMENTS

| | | |
|---|---|---|
| 5,045,417 | 9/1991 | Okamoto ...................... 430/5 |
| 5,194,345 | 3/1993 | Rolfson ........................ 430/5 |
| 5,194,346 | 3/1993 | Rolfson et al. ............... 430/5 |
| 5,229,255 | 7/1993 | White ........................... 430/5 |
| 5,281,500 | 1/1994 | Cathey et al. ................ 430/5 |
| 5,308,722 | 5/1994 | Nistler ......................... 430/5 |
| 5,543,254 | 8/1996 | Kim et al. .................... 430/5 |

*Primary Examiner*—S. Rosasco
*Attorney, Agent, or Firm*—Fletcher, Yoder & Van Someren

[57] ABSTRACT

A photomask is disclosed in which buffer regions are created in between areas of phase transitions to prevent the formation of null intensity areas on semiconductor wafers fabricated using the photomask of the present embodiment. The buffer regions are first patterned with opaque regions, which act as etch masks for adjoining phase-shifting layers. Then the opaque regions are removed, and the buffer regions may be etched to create buffer regions of varying phase angles.

24 Claims, 6 Drawing Sheets

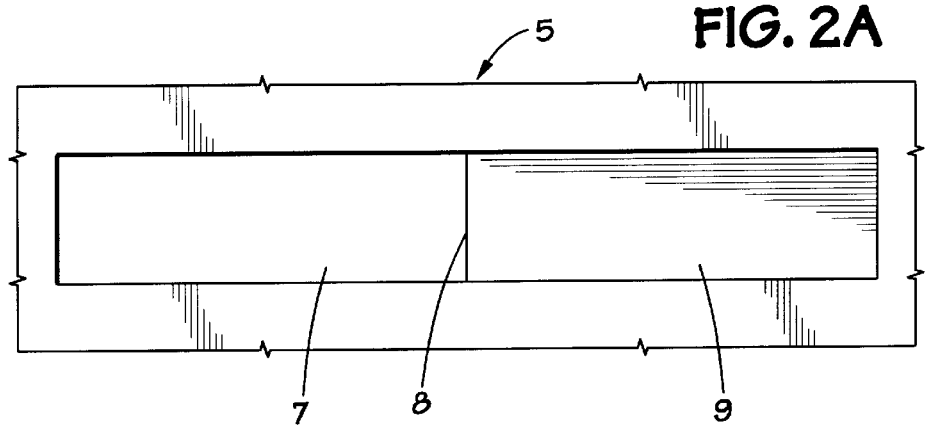
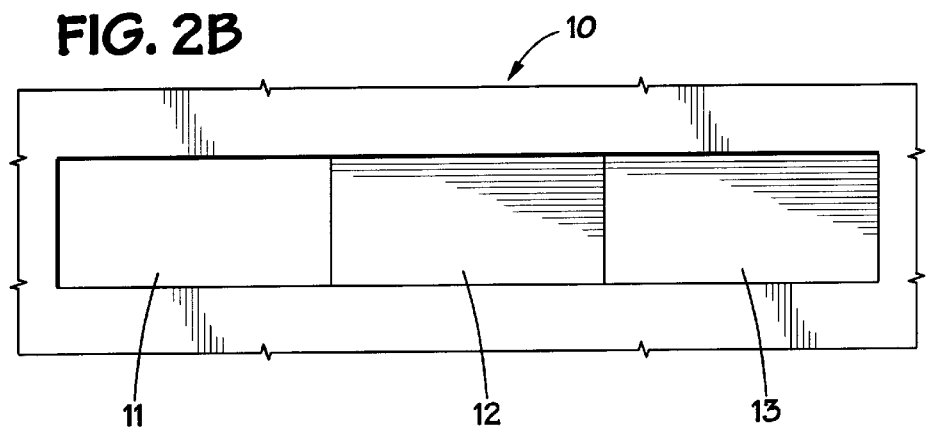
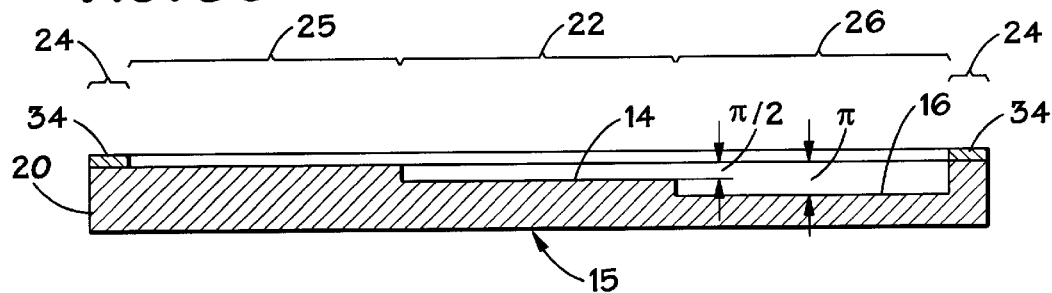
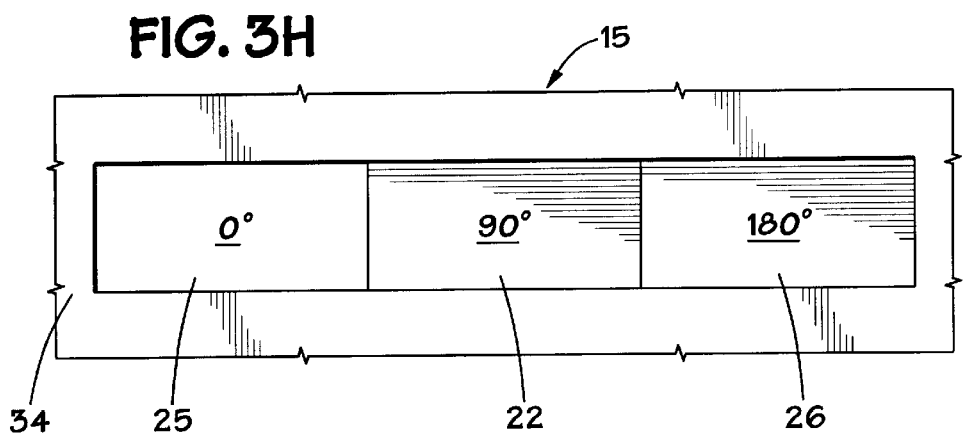

METHOD OF FABRICATING A PHASE-SHIFTING SEMICONDUCTOR PHOTOMASK

This invention was made with government support under contract no. MDA 972-92-C-0054 awarded by Advanced Research Projects Agency (ARPA). The government has certain rights in this invention.

FIELD OF THE INVENTION

The present embodiment relates to a photomask used in a photolithography process and, more specifically, to a method of fabricating a photomask.

BACKGROUND OF THE INVENTION

A photomask may be used to transfer a pattern onto a semiconductor wafer. The pattern which is to be transferred onto the wafer may be formed on a material, such as glass or quartz, which is substantially transparent. The material of the photomask may also include thin films of metal or other nontransparent material that prevent light from passing through selected portions of the photomask. In typical photomasks, the nontransparent material is opaque chrome.

Due to limitations imposed by the wavelength of light used to transfer the pattern, resolution degrades at the edges of the patterns of the photomask. Phase-shifting photomasks increase the resolution of patterns by creating phase-shifting regions in the transparent areas of a photomask. Standard phase-shift photomasks generally are formed either by (1) depositing transparent films of appropriate thickness and patterning them over the desired transparent areas using a second level lithography and etch technique, or (2) etching vertical trenches in the substrate. In both of these instances, the phase of light is shifted due to it traveling an additional distance through the transparent phase-shifting area.

The characteristics of the photomask described above generally relate to a hard or strong phase-shifter type. This type of photomask is known as an "alternating aperture" or "Levenson-type" phase-shift mask. These types of masks include transmission areas (light transmitted through the transparent areas) on either side of a patterned opaque feature. One of these transmission areas transmits light, for example, 180° out of phase from the other transmission area, and both sides transmit approximately 100% of the incident radiation. Light diffracted underneath the opaque regions from these phase-shifted regions thus cancels each other, thereby creating a more intense null or "dark area." In particular photomask layouts it is possible that two transmission areas may be adjacent to each other. In certain embodiments these two transmission areas may be at different phase angles.

Fabricating this type of photomask is difficult, as the many steps required to fabricate the mask may cause defects and imperfections. For example, one type of difficulty is the presence of undesired null areas. These null areas may be produced by phase edge transitions in which two phase-shifting layers meet. For example, in FIG. 1, a photomask 5 is shown having both 0° and 180° phase-shift regions. As shown in FIG. 1, a 0° phase pattern 7 may be located next to a 180° phase pattern 9, thereby creating a 0° to 180° phase edge transition 8. As shown in FIG. 1, this transition may cause an undesired null area. This null area may cause an undesired dark feature, known as a "stringer," to be reproduced in a photoresist layer of a wafer being processed using the photomask. This stringer feature may cause a device created on the semiconductor wafer to be inoperative. It is appreciated that stringers or other undesired null features may occur in other configurations and circuit designs.

The present invention presents buffer regions which are disposed between phase transitions of phase-shifting layers of varying phase angles. Further, the present invention performs more than one etch in order to minimize the drawback of defects causing a full 180° phase error which would cause a stringer to be reproduced onto a wafer processed using the photomask.

SUMMARY OF THE INVENTION

A method of fabricating a photomask is disclosed which may include the steps of providing a transparent substrate including pattern regions and buffer regions over which may be a patterned opaque layer including patterns and buffers, applying a photoresist layer above the transparent substrate and patterning the photoresist layer to expose at least portions of the buffers and portions of the transparent substrate, partially etching the transparent substrate to form a first pre-selected partial phase-shift angle, removing at least portions of the buffers, and partially etching the transparent substrate by a second pre-selected partial phase-shift angle.

A photomask according to the present embodiment may be used in the fabrication of semiconductor wafers. The photomask may include a transparent substrate having phase-shifting regions formed therein, at least two of the phase-shifting regions having different phase angles, a plurality of opaque pattern regions on the transparent substrate, at least one buffer region interposed between selected ones of the phase-shifting regions, wherein the phase-shifting regions are formed using an etch mask material that may be the same material as the opaque pattern regions.

BRIEF DESCRIPTION OF THE DRAWINGS

A better appreciation of the present embodiment may be gained from a study of the specific disclosed embodiments and of the drawings in which:

FIG. 2A is a top view showing a close-up of a phase transition of 0° to 180°.

FIG. 2B is a top view showing a close-up of a phase transition according to the present embodiment.

FIG. 3G is a cross-sectional diagram showing a photomask fabricated according to one embodiment of the present invention.

FIG. 3H is a top view diagram showing a photomask fabricated according to one embodiment of the present invention.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In the present embodiment, a photomask is formed in which, for example, undesirable 0° to 180° phase transitions may be eliminated. Other phase transitions may be eliminated using the methods of the present embodiment. Using the methods of the present embodiment, a photomask may be formed in which there may be, for example, 0° to 60° to 120° to 180° phase transitions, or 0° to 90° to 180° phase transitions, for example. These transitions may be achieved by creating a buffer region between the 0° and the 180° phase-shifting regions.

Figure 1:
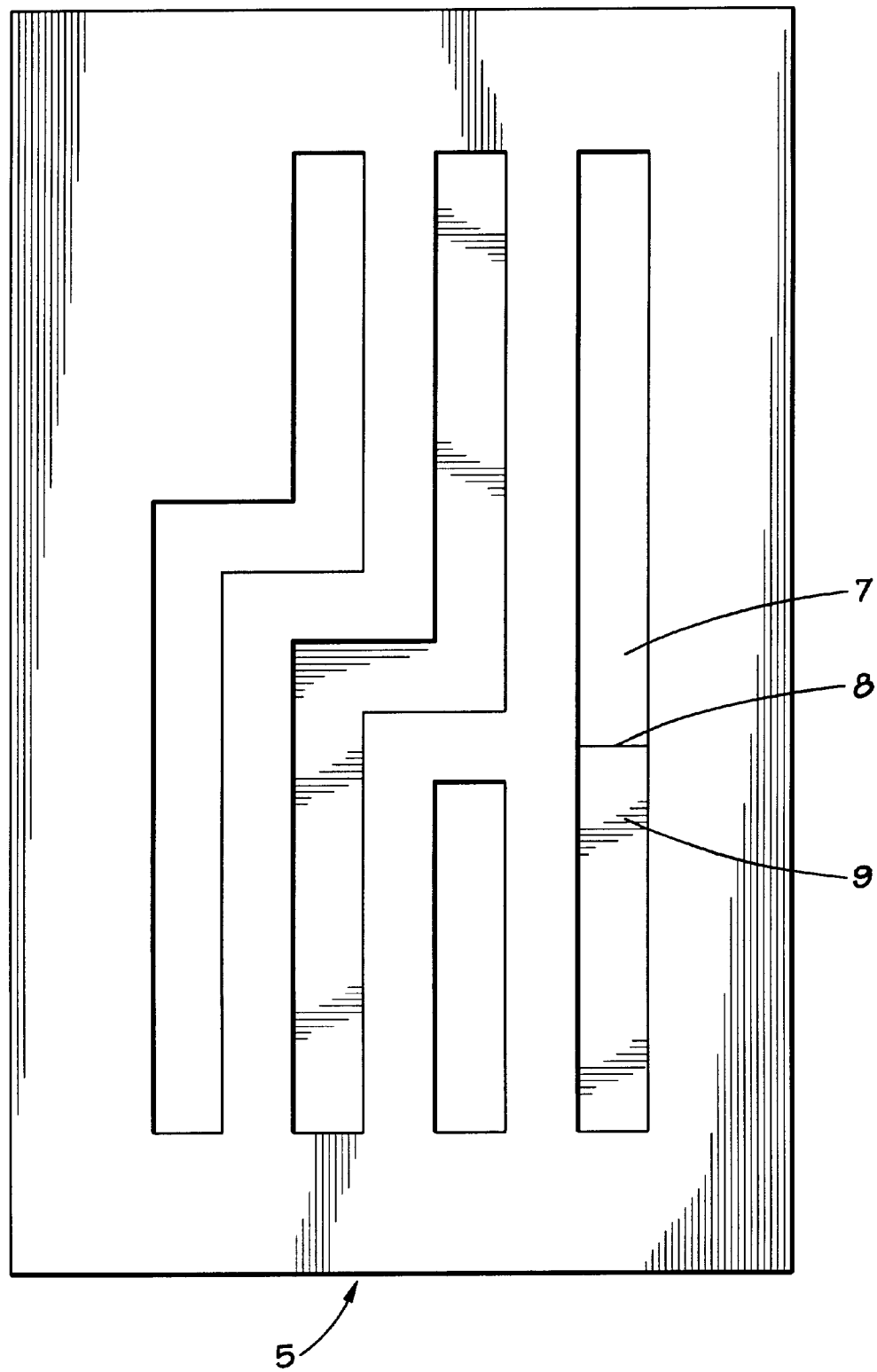
FIG. 1 is a top view showing a photomask substrate having a 0° to 180° phase edge transition and associated null area.

FIG. 2A is a top view close-up of the photomask 5 of FIG. 1. As shown in FIG. 2A, the transition from 0° to 180° creates an undesirable phase transition edge 8, which may create a null area which may be undesirably printed onto a semiconductor wafer. FIG. 2B shows a top view of a photomask 10 according to the present embodiment. The undesirable 0° to 180° phase transition edge 8 of FIG. 2A is replaced by a buffer region 12 which may be, for example, a 90° phase-shifting buffer.

Figure 3A:
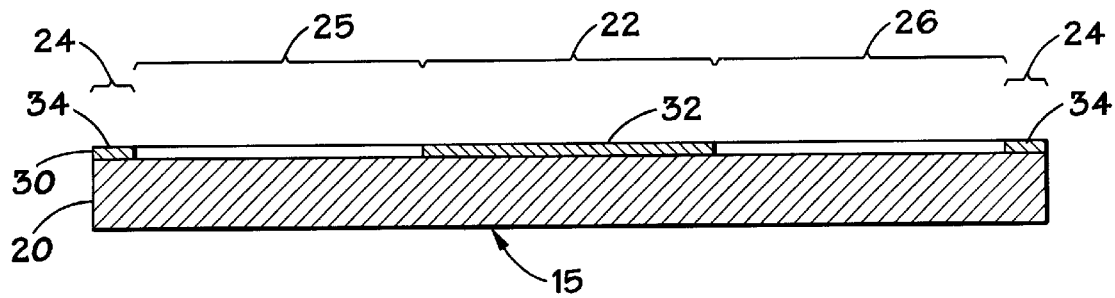
FIG. 3A is a cross-sectional diagram showing a patterned opaque layer on a substrate.

FIGS. 3A–3H show a photomask 15, and a method of fabricating a photomask which eliminates undesirable 0° to 180° phase transition edges. The photomask 15 may be comprised of a substrate 20 which may be, for example, quartz, glass, or any other transparent material. The substrate 20 may have a plurality of pattern regions 24, phase-shifting regions 26, unshifted regions 25, and buffer regions 22. Above the substrate 20 may be a layer 30 of light-blocking material or opaque layer, as shown in FIG. 3A. The layer 30 may be patterned to have a plurality of patterns 34 in pattern regions 24, which define devices to be formed on semiconductor wafers. Additionally, layer 30 may also include a plurality of buffers 32 in buffer regions 22, which may be used to separate, for example, 0° and 180° phase transitions to aid in prevention of nulls. In an exemplary embodiment, the width of a buffer may be between 0.1 μm and 1 μm at the wafer level, and more advantageously, between 0.2 μm and 0.4 μm at the wafer level. The opaque layer 30 may be, for example, chrome, molybdenum, gold or amorphous silicon. It is to be understood that the regions shown are exemplary only, and a photomask may be fabricated according to the present embodiment that has more or less pattern and buffer regions and patterns and buffers. Further, it is to be noted that for ease of explanation, pattern regions, buffer regions, phase-shifting regions, and patterns and buffers may be referred to in the singular. It is to be understood that the figures and explanations are exemplary only, and a photomask may include a plurality of all of these elements.

Figure 3B:
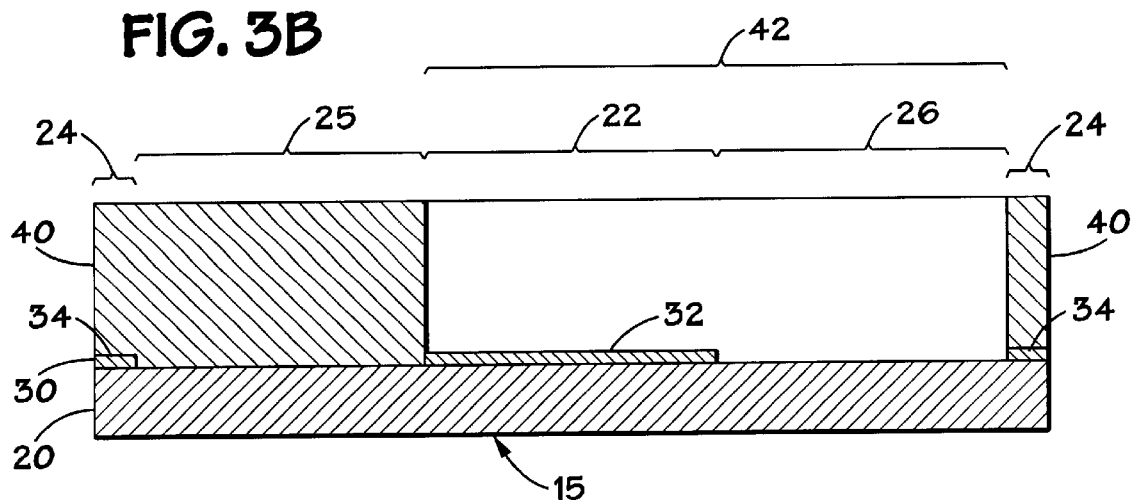
FIG. 3B is a cross-sectional diagram showing a patterned photoresist layer selectively retained over portions of a transparent region and an opaque layer of the substrate of FIG. 3A.
Figure 3C:
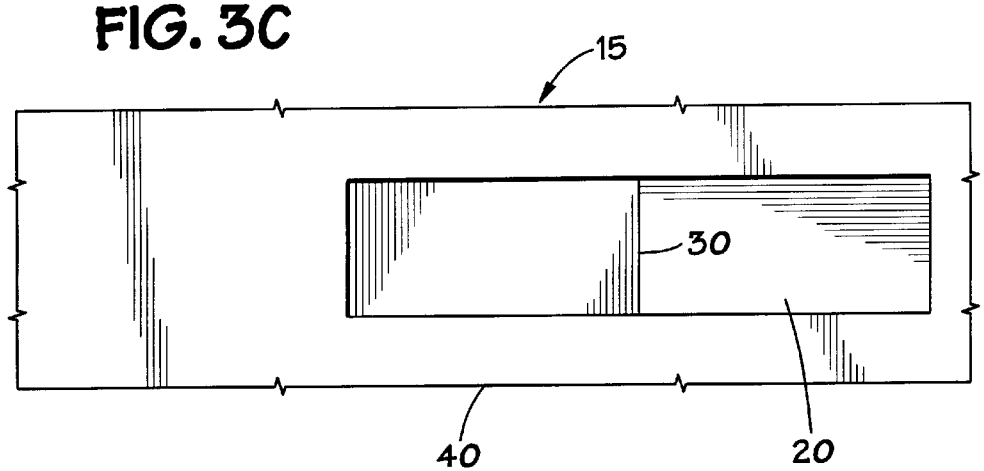
FIG. 3C is a top view diagram of FIG. 3B.

Above this layer 30 a photoresist layer 40 may be placed. The photoresist layer 40 may be comprised of any commercially available photoresist, such as OCG895i. The photoresist layer 40 may be patterned using standard lithography techniques. As shown in FIG. 3B, the photoresist layer 40 may be patterned to form openings, such as opening 42, which thereby expose portions of the substrate 20 and portions of opaque layer 30. In certain embodiments, it may be desired to expose at least some of the phase-shifting regions 26 of the substrate 20, and the buffers 32 of opaque layer 30. FIG. 3C shows a top view of the patterned photoresist layer 40, exposing portions of opaque layer 30 and substrate 20.

Figure 3D:
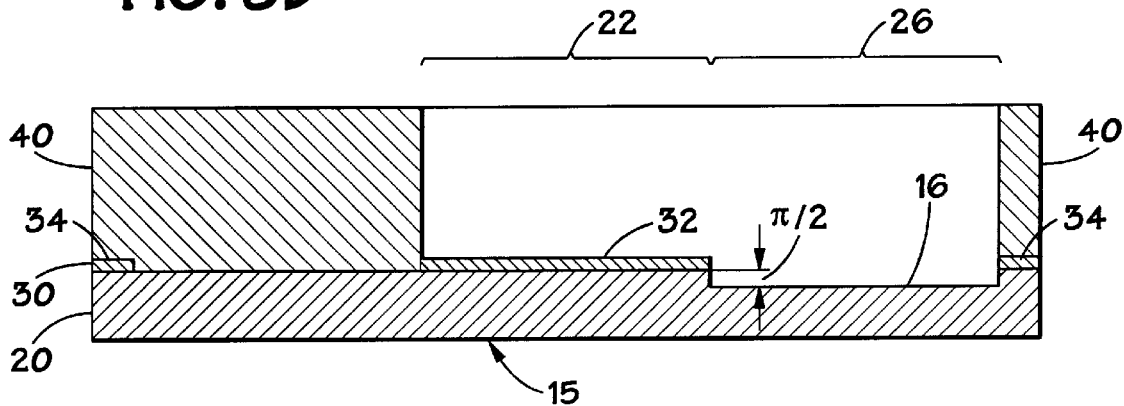
FIG. 3D is a cross-sectional diagram showing the substrate of FIG. 3B partially etched.

After patterning the photoresist layer 40, the photomask 15 may be subjected to an etch process to partially etch an opening 16 into the exposed phase-shifting regions 26 of the substrate 20 as shown in FIG. 3D. The etch may be, for example a reactive ion etch (RIE) utilizing fluorine chemistries where it is desired to etch the quartz substrate. It is to be noted that the present embodiment uses the buffers 32 over buffer regions 22 as etch masks. The present embodiment requires only a single layer of photoresist to be coated and patterned. In an exemplary embodiment, it may be desired to etch the substrate 20 to create a phase-shift of π/2 radians in phase-shifting region 26. It is to be noted that a phase-shift of π radians is equivalent to 180°, and that degrees and radians may be used interchangeably. In other embodiments, the phase-shifting regions 26 of substrate 20 may be etched to various phase angles ranging from 30° to 150°. The thickness of the depth to be etched for a π/2 phase-shift may be approximately 1900 Å for an i-line (365 mn) incident wavelength. For other incident wavelengths, the thickness of the etch step for a phase-shift of 180° may be calculated according to the equation:

$$\text{thickness} = i \times \lambda / 2(n-1) \qquad [1]$$

where i is an odd integer, λ is the incident wavelength, and n is the refractive index of the substrate material, and 1 is the index of refraction of air.

Figure 3E:
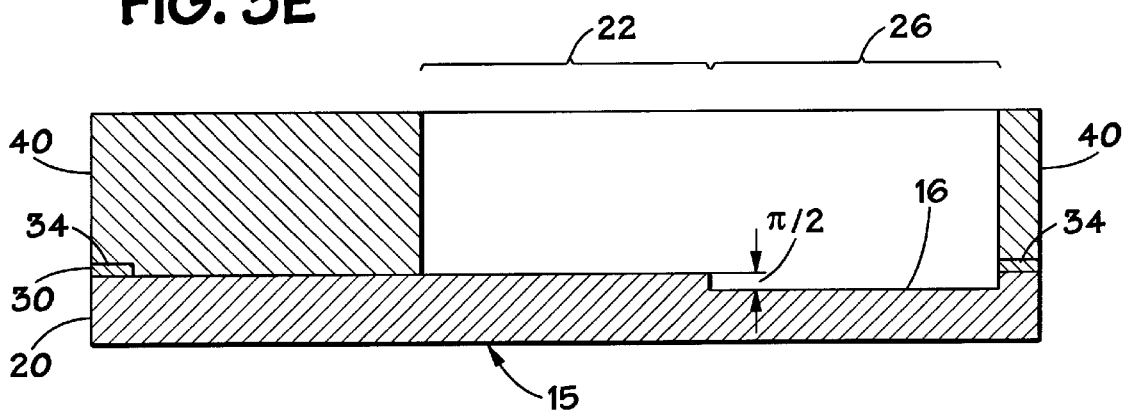
FIG. 3E is a cross-sectional diagram showing the substrate of FIG. 3C with a portion of the opaque layer removed.
Figure 3F:
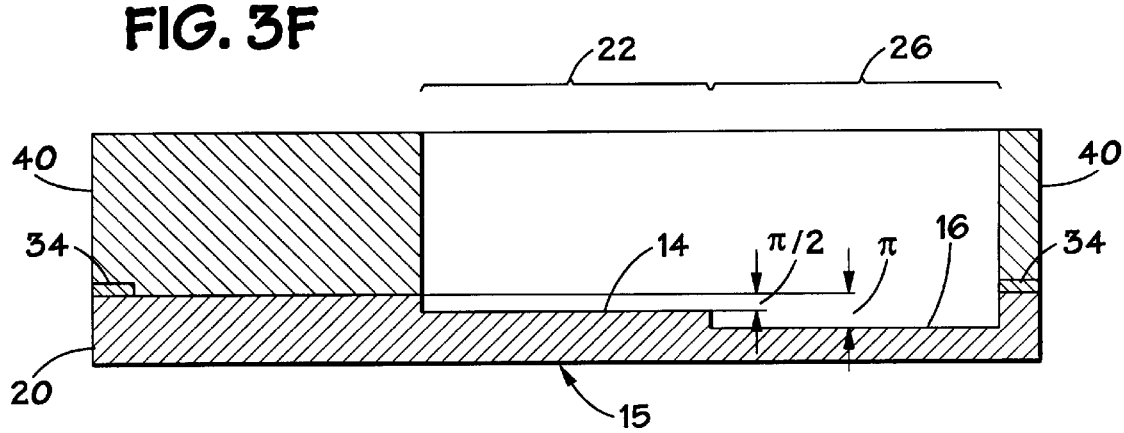
FIG. 3F is a cross-sectional diagram showing the substrate of FIG. 3E partially etched.

After partially etching the phase-shifting regions 26 of substrate 20 to the desired thickness and phase angle, the exposed portions of layer 30 may be removed as shown in FIG. 3E, thereby exposing the buffer region 22 of the substrate 20. The buffers 32 of layer 30 may be removed by an etch process, for example, a plasma etch using a combination of $O_2$ and $Cl_2$. Alternately, the buffers 32 of layer 30 may be removed by a wet etch process using, for example, a mixture of ammonium cerric nitrate, such as CR-14S, commercially available from Cyantek, Inc. After etching the exposed portions of the layer 30, another partial etch step may be performed to etch exposed portions of the substrate 20, which may include the buffer region 22 and the phase-shifting region 26 of substrate 20. It is to be noted that prior to a second partial etch step, the phase-shifting region 26 of substrate 20 may already have a phase-shift depth of π/2 from the first partial etch. The second partial etch step may etch the substrate 20 to create a phase-shift of π/2 within the buffer region 22 (formerly having buffer 32 of layer 30 above it), and create a phase-shift of π on the phase-shifting region 26 of substrate 20 that was previously etched to π/2, as shown in FIG. 3F. This second partial etch thereby increases the depth of opening 16, and creates an opening 14 in the buffer region 22.

After performing the second partial etch step, further processing steps may occur. For example, the remaining photoresist layer 40 may be removed, as shown in FIG. 3G. Then, the substrate 20 may be etched to remove any rough features on the surface of substrate 20. This etch step may be performed using, for example, a solution of HF. In an exemplary embodiment, the solution may be 100:1 HF, and the substrate 20 may be dipped into the solution for approximately 30 seconds.

FIG. 3H shows a top view of a photomask fabricated according to the present invention. Photomask 15 includes a pattern 34 that surrounds the phase-shifting and buffer regions. A buffer region 22 is shown having a phase-shift of 90°. This buffer region 22 thereby isolates a 0° phase region 25 from a 180° phase-shifting region 26. It is to be noted that these regions are exemplary only, and the buffer regions of the present embodiment may be used to separate phase transitions of varying phase angles.

Figure 4A:
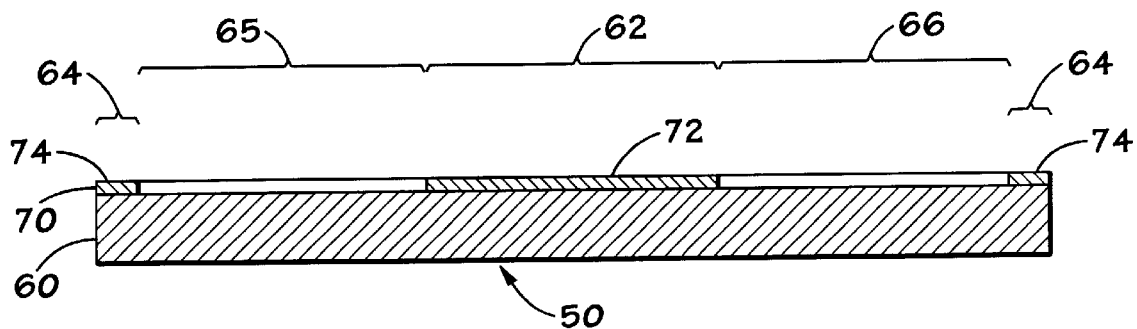
FIG. 4A is a cross-sectional diagram showing a patterned opaque layer on a substrate.

FIGS. 4A–4F show an alternate embodiment of fabricating a photomask according to the present embodiment. This alternate embodiment may be used, for example, when it is desired to create a more gradual phase-shift buffer region. Fabrication of a multi-phase buffer region may be desired to prevent defects in the buffer region from printing onto a semiconductor wafer. This multi-phase buffer region may be more desirable because a 0°/90°/180° transition will cause a defect to print sooner for a given amount of defocus of the incident light than a 0°/60°/120°/180° transition, for example. As shown in FIG. 4A, the photomask 50 may be comprised of a substrate 60 which may be, for example, quartz, glass, or any other transparent material. The substrate 60 may include a plurality of pattern regions 64, a plurality of buffer regions 62, a plurality of unshifted regions 65, and a plurality of phase-shifting regions 66. Above the substrate 60 may be a patterned layer 70 of light-blocking material. This layer 70 may be, for example, chrome, molybdenum, gold or amorphous silicon. Layer 70 may include a plurality of patterns 74 in pattern regions 64 and a plurality of buffers 72 in buffer regions 62. Above this opaque layer 70, a photoresist layer 80 may be placed. The photoresist layer 80 may be comprised of any commercially available photoresist, such as OCG895i. The photoresist layer 80 may be patterned using standard lithography techniques.

Figure 4B:
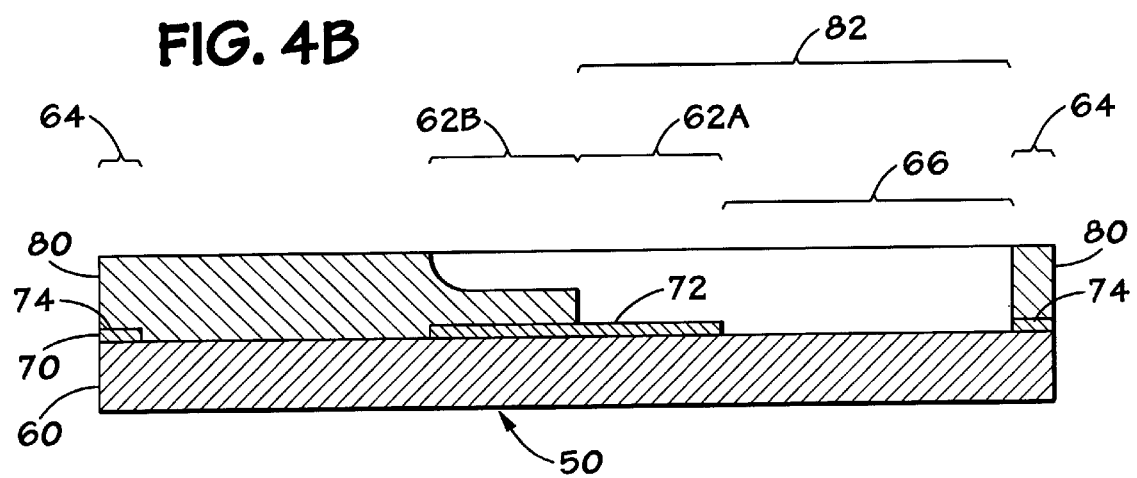
FIG. 4B is a cross-sectional diagram showing a patterned photoresist layer selectively retained over portions of a transparent region and an opaque layer of the substrate of FIG. 4A.

As shown in FIG. 4B, the photoresist layer 80 may be patterned to form openings, such as opening 82, which thereby expose portions of the substrate 60 and portions of layer 70. In this embodiment it may be desired to pattern openings in photoresist layer 80 to partially expose the buffers 72 in buffer regions 62. This partial exposing of the buffer regions 62 permits the creation of a buffer 72 of multiple phases.

For example, buffer region 62 may be comprised of primary, secondary and tertiary buffer regions. In this embodiment, buffer region 62 may have a primary buffer region 62A and a secondary buffer region 62B. It is also noted in FIG. 4B that portions of the remaining photoresist layer 80 over the buffer 72 are not of full thickness. These portions of thinner thickness may occur because during writing of the pattern into the photoresist layer 80, the exposed region over the layer 70 is underexposed, thereby causing the resist layer 80 to be of less than full thickness because the resist is not rendered fully soluble in the developer solution and therefore is only of partial thickness.

Typically, the resist layer 80 may be approximately 7000 Å to 12000 Å thick. In the thinner part of layer 80, the thickness may be between 2000 Å and 5000 Å thick.

Figure 4C:
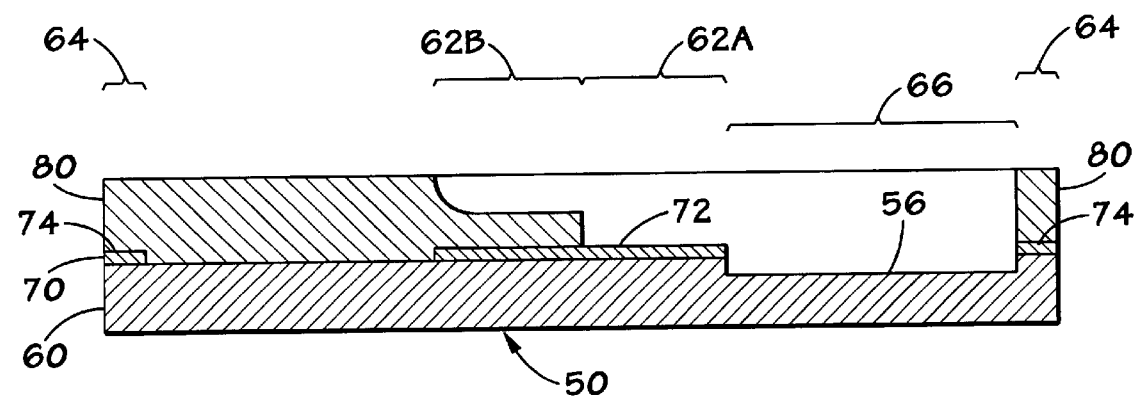
FIG. 4C is a cross-sectional diagram showing the substrate of FIG. 4B partially etched.

After patterning the photoresist layer 80, the photomask 50 may be subjected to an etch step to partially etch an opening 56 into the phase-shifting regions 66 of the substrate 60, as shown in FIG. 4C. As discussed above, the etch may be, for example, a reactive ion etch (RIE). In an exemplary embodiment, it may be desired to partially etch the phase-shifting region 66 of substrate 60 to create a phase-shift of, for example, π/3. The thickness of the depth to be etched may be approximately 1265 Å for an i-line incident wavelength. For other incident wavelengths, the thickness may be calculated according to equation [1] described above. Again, as discussed above, the buffer 72 of layer 70 acts as a mask layer to block the etching of the substrate 60 underlying the buffer region 62.

Figure 4D:
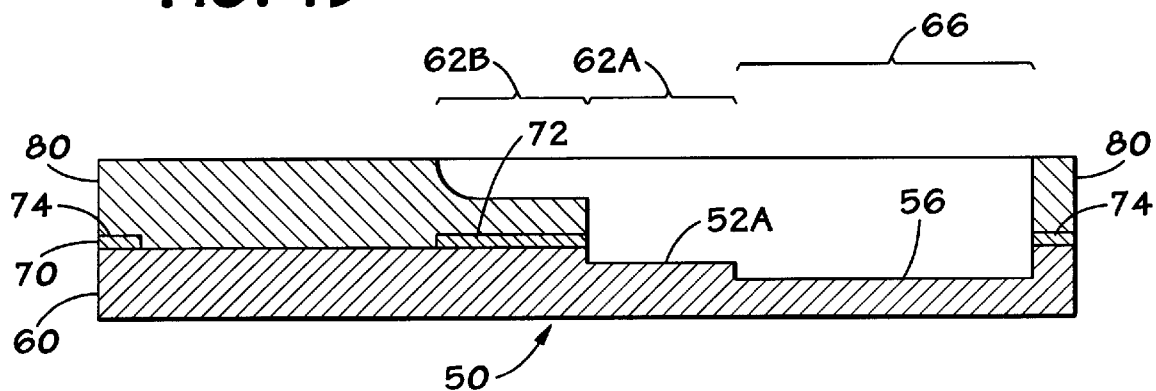
FIG. 4D is a cross-sectional diagram the substrate of FIG. 4C with a portion of the opaque layer removed and the substrate further partially etched.

After etching the phase-shifting region 66 of substrate 60 to the desired thickness, the primary buffer region 62A, which may comprise the exposed portions of the buffer 72 of layer 70 may be removed. The layer may be removed by an etch process, for example, a plasma etch using a combination of $O_2$ and $Cl_2$, or a wet etch process using, for example CR-14S. After etching the exposed portions of the buffer 72, another partial etch step may be performed to etch exposed portions of the substrate 60, which now include the phase-shift region 66 and the primary buffer region 62A. The etch step may etch the substrate 60 to create opening 52A, and thicken the depth of opening 56. This etch step creates, for example, a phase-shift of π/3 on the area of the primary buffer region 62A, and creates a phase-shift of 2π/3 on the phase-shifting region 66, as shown in FIG. 4D. In certain embodiments, using certain chemicals, such as $O_2$ plasma or an $O_2/N_2$ plasma as an etchant, the etchant may sufficiently etch the resist layer 80 of lesser thickness to expose the buffer 72 in secondary buffer region 62B.

Figure 4E:
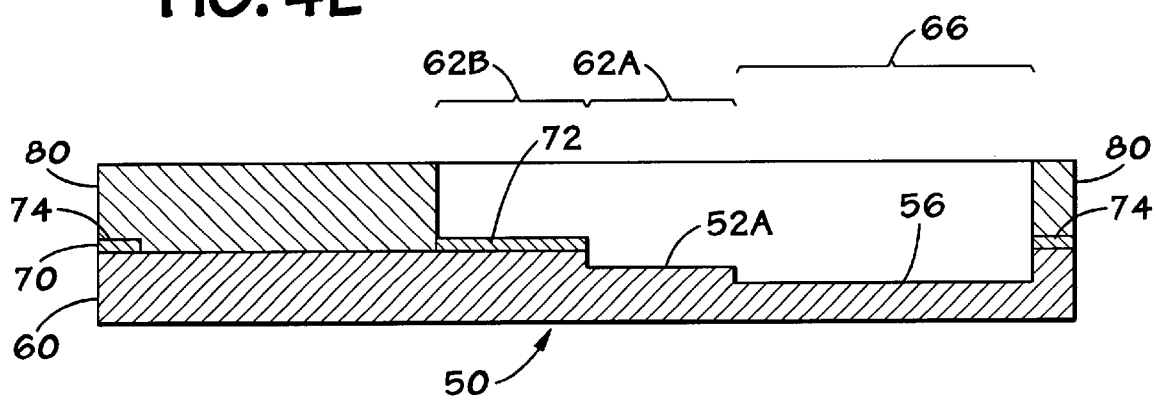
FIG. 4E is a cross-sectional diagram showing the substrate of FIG. 4D with a portion of the photoresist layer removed.

Alternately, if this etch step does not sufficiently etch the resist layer 80 of lesser thickness, it may be desired to remove the resist layer 80 of lesser thickness. This may be accomplished by, for example, an $O_2$ plasma etch. The etch process may remove the desired portion of the photoresist layer 80. The result of the removal of the desired portion of the photoresist layer 80 is shown in FIG. 4E, in which a secondary buffer region 62B of the buffer 72 is exposed.

Figure 4F:
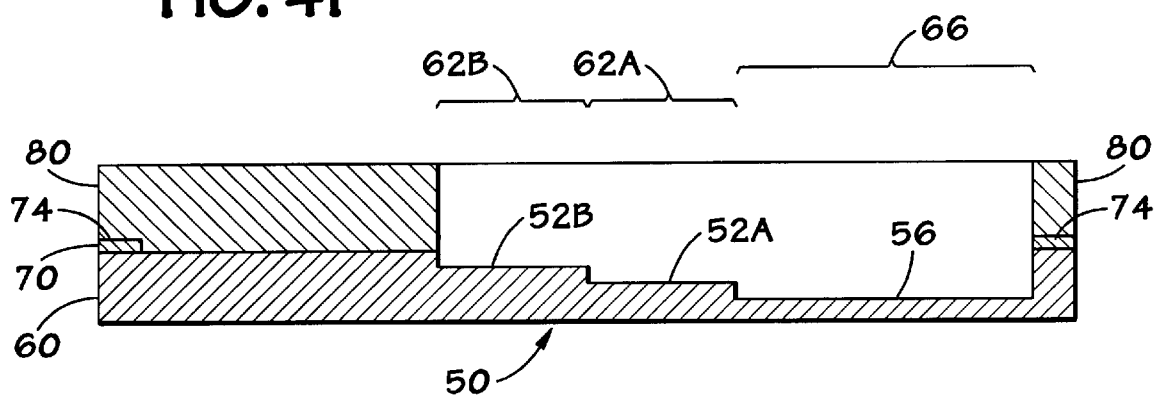
FIG. 4F is a cross-sectional diagram showing the substrate of 4E with a further portion of the opaque layer removed and the substrate further partially etched.

After this step, the exposed buffer 72 of the secondary buffer region 62B may be etched away. Then, a third partial etch step may be performed. The etch step may be performed such that exposed portions of the substrate 60 are etched by a thickness equivalent to π/3. This etch step thereby reduces the thickness of the exposed portions of the substrate 60. As shown in FIG. 4F, this etching may create an opening 52B in secondary buffer region 62B, and expand the thickness of openings 52A and 56. Thus, the primary buffer region 62A may have a phase-shift of 2 π/3 and the secondary buffer region 62B may have a phase-shift of π/3. Further, the etch step may thereby create a phase-shift of π in the phase-shifting region 66.

Therefore, using the methods of the present embodiment, a photomask is created having a phase-shift buffer region in between regions of, for example, a 0° and 180° phase-shift, thereby eliminating phase edge transitions of 0° to 180° and associated intensity nulls.

The result of these processing steps creates a photomask having buffer regions between phase transition edges. The photomask may be used in the fabrication of semiconductor wafers. By using a patterned photomask according to the present embodiment, a pattern having, for example, phase transitions from 0° to 180° may be imaged to minimize associated nulls, because of the buffer regions created by the present embodiment.

What is claimed is:

1. A method of fabricating a photomask, comprising the steps of:

providing a transparent substrate including pattern regions and buffer regions, said transparent substrate having a patterned opaque layer above it, said patterned opaque layer including patterns and buffers;

applying a photoresist layer above said transparent substrate;

patterning said photoresist layer to expose at least portions of said buffers and portions of said transparent substrate;

partially etching said transparent substrate to form a first pre-selected phase-shift angle;

removing at least portions of said buffers; and partially etching said transparent substrate to form a second pre-selected phase-shift angle.

2. A method as claimed in claim 1, wherein said first and second pre-selected phase-shift angles comprise the same angle.

3. A method as claimed in claim 1, wherein said buffers act as masks for said etching step of said first pre-selected partial phase-shift angle.

4. A method as claimed in claim 1, wherein said buffers are comprised of chrome.

5. A method as claimed in claim 1, wherein said preselected phase-shift angles are selected from the group of 180°/n, where n is an integer between 2 and 5.

6. A method as claimed in claim 1, wherein said substrate comprises quartz.

7. A method as claimed in claim 1, wherein said partially etching step of said second pre-selected phase-shift angle prevents null formation in a phase edge transition.

8. A method as claimed in claim 7, wherein said phase edge transition comprises 0° to 180°.

9. A method as claimed is claim 1, wherein said partially etching steps create phase-shifting regions.

10. A method as claimed in claim 1, wherein said partially etching steps create buffer regions.

11. A method as claimed in claim 1, wherein said first and second phase-shift angles comprise 90°.

12. A method as claimed in claim 1, further comprising the steps of:

removing at least portions of said patterned photoresist layer;

removing a further portion of said buffers; and partially etching said transparent substrate to form a third pre-selected phase-shift angle.

13. A method as claimed in claim 12, wherein said first, second and third pre-selected phase-shift angles are the same angle.

14. A method as claimed in claim 12, wherein said preselected phase-shift angles are selected from the group of 180°/n, where n is an integer between 3 and 5.

15. A method as claimed in claim 12, wherein said first, second, and third phase-shift angels comprise 60°.

16. A method of fabricating a photomask, comprising:

forming phase-shifting regions in a transparent substrate, at least two of said phase-shifting regions having different phase angles; and forming at least one buffer region in said transparent substrate interposed between selected said phase-shifting regions said at least one buffer region having a phase angle value between phase angle values of said selected phase-shifting regions, said at least one buffer region formed from patterning an opaque layer over said buffer region of said transparent substrate.

17. A method as claimed in claim 16, further comprising the steps of removing said opaque layer, and etching said transparent substrate.

18. A photomask used in the fabrication of semiconductor wafers, comprising:

a transparent substrate having phase-shifting regions formed therein, at least two of said phase-shifting regions having different phase angles;

a plurality of opaque pattern regions on said transparent substrate, said plurality of opaque pattern regions including opaque material; and at least one buffer region interposed between selected said phase-shifting regions, wherein said phase-shifting regions are formed using an etch mask material, said etch mask material being the same material as said opaque material.

19. A photomask as claimed in claim 18, wherein said different phase angles are 0° and 180°.

20. A photomask as claimed in claim 18, wherein said phase-shifting regions are formed by an etch process.

21. A photomask as claimed in claim 18, wherein said at least one buffer region comprises a 90° phase-shift.

22. A photomask as claimed in claim 18, wherein said opaque pattern regions are comprised of chrome.

23. A method of fabricating a photomask, comprising:

providing a transparent substrate having pattern regions, buffer regions and phase-shifting regions, said transparent substrate having a plurality of opaque regions above it;

forming a plurality of phase-shifting openings within said phase-shifting regions;

using at least a portion of said plurality of opaque regions within said buffer regions as an etch mask material in said forming step; and forming a plurality of buffers in said buffer regions between said phase-shifting regions.

24. A method as claimed in claim 23, wherein said plurality of buffers have phase angle values between phase angle values of said phase-shifting regions.

* * * * *